(12) United States Patent
Fukumoto et al.

(10) Patent No.: US 10,669,628 B2
(45) Date of Patent: Jun. 2, 2020

(54) METHOD FOR MANUFACTURING LAMINATE AND METHOD FOR MANUFACTURING LIQUID DISCHARGE HEAD

(71) Applicant: CANON KABUSHIKI KAISHA, Tokyo (JP)

(72) Inventors: Yoshiyuki Fukumoto, Kawasaki (JP); Atsunori Terasaki, Kawasaki (JP); Ryoji Kanri, Zushi (JP)

(73) Assignee: Canon Kabushiki Kaisha, Tokyo (JP)

( * ) Notice: Subject to any disclaimer, the term of this patent is extended or adjusted under 35 U.S.C. 154(b) by 26 days.

(21) Appl. No.: 15/960,375

(22) Filed: Apr. 23, 2018

(65) Prior Publication Data

US 2018/0312971 A1 Nov. 1, 2018

(30) Foreign Application Priority Data

Apr. 28, 2017 (JP) .................. 2017-089519

(51) Int. Cl.
| | |
|---|---|
| *B41J 2/14* | (2006.01) |
| *C23C 16/455* | (2006.01) |
| *C23C 16/40* | (2006.01) |
| *B41J 2/16* | (2006.01) |
| *B32B 27/08* | (2006.01) |
| *C23C 16/56* | (2006.01) |

(52) U.S. Cl.
CPC ........ *C23C 16/45525* (2013.01); *B32B 27/08* (2013.01); *B41J 2/14145* (2013.01); *B41J 2/1603* (2013.01); *B41J 2/1623* (2013.01); *B41J 2/1628* (2013.01); *B41J 2/1629* (2013.01); *B41J 2/1631* (2013.01); *B41J 2/1642* (2013.01); *B41J 2/1645* (2013.01); *C23C 16/40* (2013.01); *C23C 16/401* (2013.01); *C23C 16/405* (2013.01); *C23C 16/45555* (2013.01); *C23C 16/56* (2013.01)

(58) Field of Classification Search
CPC ....... B41J 2/135; B41J 2/14; B41J 2/16; B41J 2/1623; B41J 2/1628; B41J 2/1629; C23C 16/45525; C23C 16/40
See application file for complete search history.

(56) References Cited

U.S. PATENT DOCUMENTS

| | | | | |
|---|---|---|---|---|
| 7,293,859 | B2 * | 11/2007 | Kubota | .................. B41J 2/1404 347/61 |
| 8,622,523 | B2 * | 1/2014 | Asai | ........................ B41J 2/1404 239/533.12 |
| 8,778,200 | B2 * | 7/2014 | Kubota | .................. B41J 2/1603 216/2 |

(Continued)

FOREIGN PATENT DOCUMENTS

| | | | | |
|---|---|---|---|---|
| JP | 2009-113229 | A | 5/2009 | |
| JP | 2009-172871 | * | 8/2009 | ................ B41J 2/16 |
| WO | WO 2016/031920 | * | 3/2016 | ................ B41J 2/14 |

*Primary Examiner* — Bret P Chen
(74) *Attorney, Agent, or Firm* — Canon U.S.A. Inc., IP Division

(57) ABSTRACT

A method for manufacturing a laminate has a process of forming a film on a substrate by an atomic layer deposition method and a process of forming a layer containing a compound polymerizable with acid and an acid generator, and then curing the layer to form resin layer on the film, in which the nitrogen atom atomic composition ratio of the film is 2.5% or less.

10 Claims, 5 Drawing Sheets

(56) References Cited

U.S. PATENT DOCUMENTS

| | | | | |
|---|---|---|---|---|
| 9,102,147 B2* | 8/2015 | Yoneta | .................. | B41J 2/14274 |
| 10,150,292 B2* | 12/2018 | Kanri | ........................ | B41J 2/162 |
| 10,457,044 B2* | 10/2019 | Kato | .................... | B41J 2/14145 |
| 2004/0017442 A1* | 1/2004 | Hirasawa | ............. | B41J 2/14233 |
| | | | | 347/72 |
| 2006/0114295 A1* | 6/2006 | Asai | ....................... | B41J 2/1404 |
| | | | | 347/65 |
| 2009/0025221 A1* | 1/2009 | Saito | ..................... | B41J 2/1603 |
| | | | | 29/890.1 |
| 2010/0300529 A1* | 12/2010 | Kawahara | ............ | H01G 9/2031 |
| | | | | 136/256 |
| 2011/0148986 A1* | 6/2011 | Murase | ................... | B41J 2/055 |
| | | | | 347/44 |
| 2011/0244393 A1* | 10/2011 | Ikeda | .................... | B41J 2/1603 |
| | | | | 430/270.1 |
| 2015/0266296 A1* | 9/2015 | Mizukami | ............ | B41J 2/14201 |
| | | | | 347/68 |
| 2015/0283813 A1* | 10/2015 | Oya | ..................... | B41J 2/14233 |
| | | | | 347/47 |
| 2016/0271955 A1* | 9/2016 | Ono | .................... | B41J 2/16535 |
| 2018/0281414 A1* | 10/2018 | Fukumoto | .............. | B41J 2/1603 |
| 2019/0291437 A1* | 9/2019 | Kakiuchi | ............... | B41J 2/1632 |

* cited by examiner

METHOD FOR MANUFACTURING LAMINATE AND METHOD FOR MANUFACTURING LIQUID DISCHARGE HEAD

BACKGROUND OF THE INVENTION

Field of the Invention

The present disclosure relates to a method for manufacturing a laminate and a method for manufacturing a liquid discharge head.

Description of the Related Art

An atomic layer deposition method is a technique including adsorbing a precursor which is a raw material of a film to the front surface, and then causing a reaction to form layers one by one in an atomic level. The atomic layer deposition method can form a film having few film defects and high quality and high density, and therefore has been used as a technique of forming a film on a substrate in a manufacturing process of a semiconductor device. Moreover, the atomic layer deposition method has high followability also to structures, such as grooves and through-holes having a high aspect ratio in which the ratio of the depth to the width is high, so that such structures can be uniformly covered. Therefore, the atomic layer deposition method has been used for the purpose of covering a three-dimensional structure also in a manufacturing process of functional devices, such as a MEMS (Micro Electro Mechanical System), such as a pressure sensor and an accelerometer, and a microfluid device.

As such a functional device, a liquid discharge head, such as an ink jet recording head, is mentioned. In the liquid discharge head, a flow passage of liquid and an energy generating element giving energy for discharging the liquid are formed on a substrate of silicon or the like. On the substrate in which the flow passage is formed, a liquid resistant film is formed in some cases in order to prevent the corrosion of the substrate front surface by liquid. Japanese Patent Laid-Open No. 2009-113229 describes providing a metal oxide film on a portion contacting an ink of the substrate in which the flow passage is formed of the liquid discharge head by the atomic layer deposition method.

SUMMARY OF THE INVENTION

A method for manufacturing a laminate according to the present disclosure has a process of forming a film on a substrate by an atomic layer deposition method and a process of forming a layer containing a compound polymerizable with acid and an acid generator, and then curing the layer to form a resin layer on the film, in which the nitrogen atom atomic composition ratio of the film is 2.5% or less.

A method for manufacturing a liquid discharge head according to the present disclosure is a method for manufacturing a liquid discharge head having a discharge port discharging liquid and an element generating energy to be utilized for discharging the liquid, in which the liquid discharge head has a laminate having a substrate, a film formed by an atomic layer deposition method on the substrate, and a resin layer formed on the film, and the laminate is formed by the above-described method for manufacturing a laminate.

Further features of the present disclosure will become apparent from the following description of exemplary embodiments with reference to the attached drawings.

DESCRIPTION OF THE EMBODIMENTS

Figure 1A:
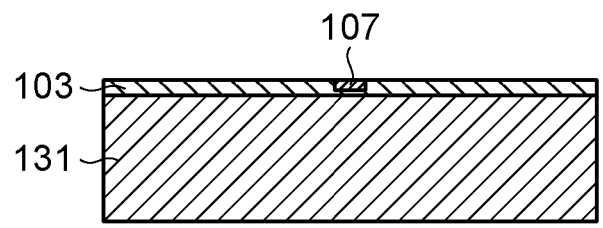
FIGS. 1A to 1G are cross-sectional views illustrating a method for manufacturing a liquid discharge head of a first embodiment of the present disclosure.

On a film formed by an atomic layer deposition method on a substrate of a functional device, a resin layer is further formed in some cases. For example, in Japanese Patent Laid-Open No. 2009-113229, an adhesive is applied as a resin layer on a liquid resistant film and another substrate is bonded through the adhesive.

However, the present inventors have been confronted with a disadvantage that, when the resin layer is formed on the film formed by the atomic layer deposition method, the adhesiveness between the resin layer and the film has decreased depending on a combination of the types of the resin layer and the film, so that the resin layer has been peeled.

The present disclosure has been made in view of such a disadvantage. The present disclosure provides a method for manufacturing a laminate having high adhesion reliability between a film formed by an atomic layer deposition method and a resin layer formed thereon and a liquid discharge head.

The present inventors have found that the peeling between the film formed by the atomic layer deposition method and the resin film occurs when the resin layer is formed by a resin composition containing a compound polymerizable with acid and an acid generator. As a reason therefor, the present inventors have presumed that the peeling has occurred due to the fact that a polymerization reaction by acid is blocked by a reaction byproduct generated in the film formation by the atomic layer deposition method.

The atomic layer deposition method is a technique including adsorbing a precursor serving as a raw material to the front surface, and then causing the precursor to cause a reaction to thereby form films one by one in an atomic level. First, gas containing a precursor which is a raw material of a film is sent into a vacuum chamber, about one atomic layer of precursor molecules are adsorbed to the front surface of the heated substrate, and then unreacted precursors are exhausted. When the substrate front surface is covered with the adsorbed precursors, the adsorption of the precursors does not occur any more, and therefore a state where about one layer of precursors are adsorbed can be created. Next, reactive gas (water, oxygen, ozone, nitrogen, and the like) is introduced to cause the adsorbed precursors to cause a chemical reaction to be converted to a desired compound, and then the reactive gas is exhausted. Thus, by repeating the cycle of adsorbing precursors and causing the precursors to cause a reaction for each one atomic layer, a high quality film with few film defects can be formed with good followability also to complicated structures as compared with a CVD (Chemical vapor deposition) method which is a film formation technique utilizing another chemical reaction.

In the reaction by the reactive gas, functional groups in the precursor molecules and the reactive gas react with each other, and then the functional groups of the precursor are desorbed, so that a reaction byproduct is generated. The reaction byproduct is not completely removed in the exhaust in the above-described cycle and usually partially remains in the film. Moreover, some unreacted functional groups also remain in the film. According to the atomic layer deposition method, the reactivity of the precursor is high, and therefore a large number of reaction byproducts are generated as compared with the CVD method. Therefore, it is considered that the number of reaction products remaining in a film is particularly large according to the atomic layer deposition method.

Japanese Patent Laid-Open No. 2009-113229 describes a precursor containing an alkylamino group as a functional group as a precursor to be used for the atomic layer deposition method. When a film is formed using the precursor containing an alkylamino group, alkyl amine is generated as a reaction byproduct. Nitrogen atoms in alkyl amine molecules have an unshared electron pair, and therefore hydrogen ions are likely to be attracted. Therefore, it is presumed that hydrogen ions generated from an acid generator contained in a resin layer formed on the film are attracted and captured by alkyl amine molecules remaining in the film, so that a polymerization reaction within the resin layer is blocked. It is considered that the peeling between the resin layer and the film occurs due to the fact that a polymerization reaction is blocked as described above, so that the resin layer and the film are not sufficiently stuck to each other.

Then, the present inventors have reduced the content ratio in the film of the nitrogen atoms remaining in the film after the film formation by devising the film formation conditions, such as the precursor type and the film formation temperature. According to an examination of the present inventors, it has been clarified that the adhesiveness between the film and the resin layer is good when the nitrogen atom atomic composition ratio (at %) in the film is 2.5% or less.

A method for manufacturing a laminate according to the present disclosure is described below taking a liquid discharge head as an example.

First Embodiment

A first embodiment of a method for manufacturing a liquid discharge head according to the present disclosure is described with reference to the drawings. FIGS. 1A to 1G are views illustrating a method for manufacturing a liquid discharge head according to this embodiment step by step. FIG. 1G is a completion drawing of a liquid discharge head. FIGS. 1A to 1G all illustrate cross-sectional views of the liquid discharge head.

Structure of Liquid Discharge Head

As illustrated in FIG. 1G, the liquid discharge head according to this embodiment has a first substrate 131 on which a film (first film) 121 formed by an atomic layer deposition method is formed. In the first substrate 131, a liquid flow passage 115 is provided as a through-hole and a first film 121 is formed so as to cover the inner wall surface of the flow passage 115. The details of the first film 121 are described later.

On the front surface of the first substrate 131, an energy generating element 107 generating energy to be utilized for discharging liquid is formed. Moreover, on the front surface of the first substrate 131, a surface membrane layer 103 containing a wiring film for driving the energy generating element 107 and an interlayer insulation film is formed. The details of the wiring, the insulating film, a transistor, a contact pad for electrodes, and the like are not illustrated. Furthermore, on the front surface of the first substrate 131, a discharge port formation member 119 forming a discharge port 101 discharging liquid is formed. The discharge port formation member 119 contains a top plate 117 to which the discharge port 101 is opened and a side wall 118 forming a pressure chamber 102 communicating with the discharge port 101 and giving energy generated from the energy generating element 107 to liquid. The discharge port 101 and the pressure chamber 102 can be regarded as one kind of the liquid flow passage 115.

Figure 4A:
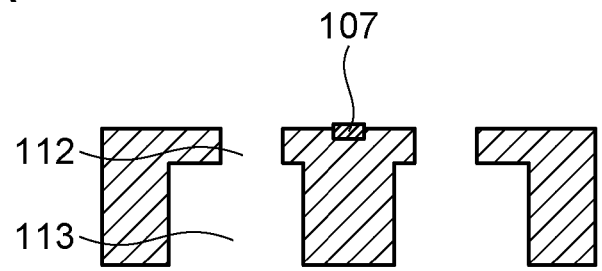
FIG. 4A is a cross-sectional view of a first substrate.
Figure 4B:
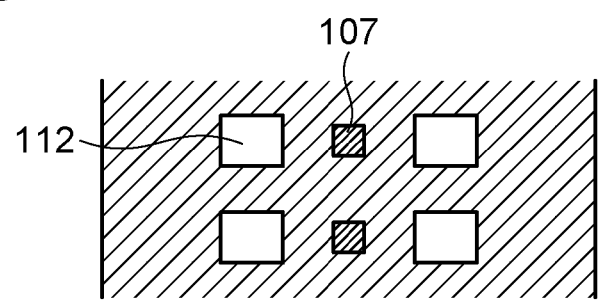
FIG. 4B is a view in which the first substrate is viewed from the front surface side.
Figure 4C:
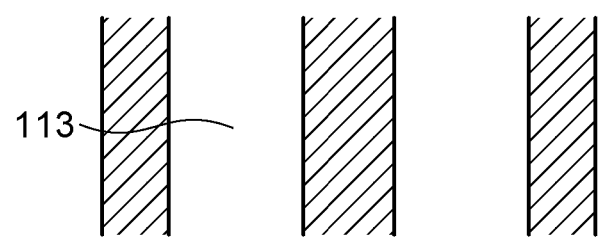
FIG. 4C is a view in which the first substrate is viewed from the rear surface side.

The flow passage 115 contains a first flow passage 112 provided on the front surface side of the first substrate 131 and a second flow passage 113 provided on the rear surface side of the first substrate 131. The first flow passage 112 is connected to a pressure chamber 102 corresponding to one discharge port 101. The structure of the flow passage 115 is illustrated in FIGS. 4A to 4C. FIG. 4A is a cross-sectional view of a first substrate, FIG. 4B is a view in which the first substrate 131 is viewed from the front surface side, and FIG. 4C is a view in which the first substrate 131 is viewed from the rear surface side. In order to make the opening by the flow passage easy to see, the energy generating element 107 formed on the first substrate 131 is illustrated together. As illustrated in FIG. 4B, a plurality of openings of the first flow passages 112 connected to the pressure chambers 102 is formed in the front surface of the first substrate 131 along the arrangement direction of the discharge ports 101. On the other hand, as illustrated in FIG. 4C, the second flow passage 113 extending along the arrangement direction of the discharge ports 101 is formed in the rear surface of the first substrate 132 and the second flow passage 113 is connected to the plurality of first flow passages 112 in the liquid discharge head and distributes liquid to each first flow passage 112.

The second substrate 132 is bonded to the rear surface of the first substrate 131 through a resin layer 122 as an adhesive layer. The first film 121 is formed over the rear surface of the first substrate 131 from the inner wall surface of the flow passage 115. The resin layer 122 is provided on the first film 121 provided on the first substrate 131. In the second substrate 132, an opening is provided as a third flow passage 114. The third flow passage 114 is brought into communication with the second flow passage 113 by the bonding of the substrates. When the third flow passage 114 of the second substrate 132 plays the role of throttling the flow passage, it is suitable that the opening of the second flow passage 113 is covered with a part of the second substrate 132. The second substrate 132 may also be covered with a film 125 formed over the front surface of the second substrate 132 from the inner wall surface of the flow passage 114 as with the first substrate 131. A region between a bonding surface with the second substrate 132 in the first substrate 131 and a bonding surface with the first substrate 131 in the second substrate 132 is defined as a bonding region. In this case, in the bonding region, the first film 121, the resin layer 122, and the film 125 of the second substrate 132 are formed in this order from the first substrate 131 side.

In the liquid discharge head illustrated in FIG. 1G, two flow passages 115a and 115b are connected to one pressure chamber 102. Liquid in the pressure chamber 102 can be circulated between the pressure chamber 102 and the outside of the pressure chamber 102 through the two flow passages 115a and 115b. Specifically, the liquid can be made to flow into the pressure chamber 102 through the flow passage 115a on the left side and can be made to flow out of the flow passage 115b on the right side as indicated by the arrow in FIG. 1G. When the liquid discharge head according to this embodiment is applied to an ink jet recording head, for example, the thickening of an ink in the discharge port 101 and the pressure chamber 102 can be prevented by the flow of the liquid.

In the liquid discharge head of this embodiment, there is a tendency that the opening area on the substrate rear surface side is larger than that on the substrate front surface side and the bonding area with other members on the substrate rear surface side is smaller than that on the substrate front surface side. In particular, in the liquid discharge head having the configuration of circulating liquid as illustrated in FIG. 1G, the width of a center portion of the rear surface of the first substrate 131 (rear side of a portion where the energy generating element 107 is formed of the first substrate 131) in FIG. 1G is narrow and the peeling in the bonding surface of this portion is likely to occur. Therefore, it is important to improve the adhesion reliability of the first film 121 and the resin layer 122 particularly on the rear surface of the first substrate 131 in the liquid discharge head having such a configuration.

Method for Manufacturing Liquid Discharge Head

1. Preparation of Substrate

First, as illustrated in FIG. 1A, the first substrate 131 is prepared on the front surface of which the surface membrane layer 103 and the energy generating element 107 are formed by a photolithography process. As the first substrate 131, various kinds of substrates suitable for forming the energy generating element 107 and the wiring film are usable. The first substrate 131 suitably contains any one selected from the group consisting of silicon, silicon carbide, silicon nitride, glass (silica glass, borosilicate glass, alkali-free glass, and soda glass), alumina, gallium arsenide, gallium nitride, aluminum nitride, and an aluminum alloy. Among the above, a silicon substrate is suitably used as the first substrate 131. Examples of the energy generating element 107 include an electrothermal conversion element and a piezoelectric element. The first substrate 131 can be thinned from the rear surface side as necessary. Examples of thinning methods include grinding or wet etching by chemical solutions, such as nitrohydrofluoric acid. The rear surface of the first substrate 131 is suitably smoothed in order to facilitate bonding in a bonding process with the second substrate 132 described later. Examples of smoothing methods include grinding by a grindstone having high coarseness, dry polish, grinding by CMP (Chemical Mechanical Polishing), dry etching by reactive gas, and wet etching by chemical solutions, such as nitrohydrofluoric acid.

Figure 1B:
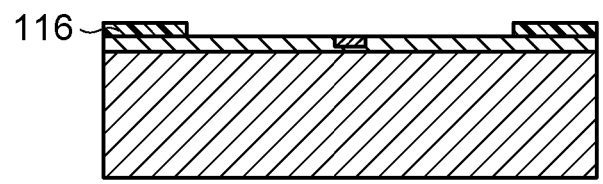

Next, as illustrated in FIG. 1B, an adhesion layer 116 for firmly sticking the discharge port formation member 119 to be formed later and the first substrate 131 to each other is formed on the front surface of the first substrate 131. For the adhesion layer 116, a polyamide resin and a benzocyclobutene resin which are stable to liquid, such as ink, are suitable. The resin is applied by spin coating or the like, followed by thermosetting, and then processed into a desired shape by dry etching through a resist mask.

Figure 1C:
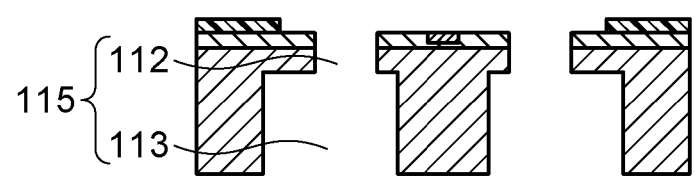

Next, as illustrated in FIG. 1C, the flow passage 115 is formed in the first substrate 131. In this embodiment, the flow passage 115 contains the first flow passage 112 and the second flow passage 113. Examples of techniques of forming the flow passages include dry etching, wet etching, laser, and sandblast. First, the second flow passage 113 of a groove shape is formed by digging the first substrate 131 from the rear surface side to the middle of the substrate 131. Furthermore, the first substrate 131 is dug from the front surface side until the first substrate 131 communicates with the second flow passage 113 to form two or more of the flow passages 112 of a hole shape. The shapes of the first flow passage 112 and the second flow passage 113 are not limited to the hole shape and the optimal shape can be selected according to the need of a device. Moreover, the order of forming the same is not limited and the second flow passage 113 may be formed after forming the first flow passage 112.

2. Process of Forming Film

Figure 1D:
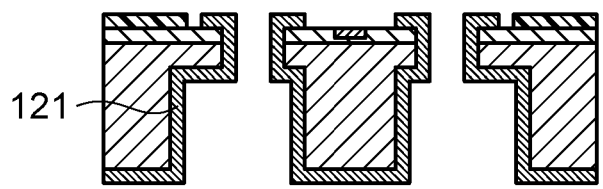

Next, as illustrated in FIG. 1D, the first film 121 is formed as a liquid resistant film by the atomic layer deposition method over the rear surface of the first substrate 131 from the inner wall surface of the flow passage 115. In order to improve the adhesiveness between the first film 121 and the resin layer formed thereon, it is important to suppress nitrogen atoms present in the first film 121 to a fixed content. According to an examination of the present inventors, the adhesiveness between the film and the resin layer is good when the nitrogen atom atomic composition ratio (at %) of the film is 2.5% or less. The nitrogen atom atomic composition ratio of the film is preferably 1.0% or less and particularly more preferably 0.0%. The nitrogen atom atomic composition ratio of the film can be measured by the photoelectron spectroscopy, the mass spectrometry of the film components by the Secondary Ion Mass Spectrometry (SIMS) of the film surface, the Auger electron spectroscopy of the film surface, and the Energy dispersive X-ray spectrometry in transmission electron observation of the film cross section. In Examples described later, the measurement was performed by the photoelectron spectroscopy. The nitrogen atom atomic composition ratio indicates the number ratio of the nitrogen atoms to all the atoms except hydrogen atoms of the film. The details of the measurement method are described in Examples.

The formation of the first film 121 by the atomic layer deposition method is suitably performed at a temperature of 200° C. or less. This is because low heat-resistant substances, such as organic resin, are used for other portions of the head in many cases in the liquid discharge head, and thus the liquid discharge head is damaged in some cases when the formation is performed at a high temperature. Furthermore, the formation of the first film 121 is suitably performed at a temperature of 100° C. or less. On the other hand, a larger number of reaction byproducts are generated as a reduction in the film formation temperature, and therefore the film formation is suitably performed at a temperature of 50° C. or more.

When the first film 121 is a liquid resistant film of the inner wall of the flow passage of the liquid discharge head as in this embodiment, the first film 121 suitably contains an oxide, a carbide, an oxynitride, or acid carbide of an element selected from Ta, Zr, Hf, Nb, Si, and Ti. Therefore, it is suitable to use a compound containing any element selected from the group consisting of Ta, Zr, Hf, Nb, Si, and Ti as a precursor for use in the formation of the first film 121.

Moreover, it is suitable to use, as the precursor, a compound having any group selected from the group consisting of an alkoxy group, an alkyl group, and a halogeno group as a functional group. Examples of the alkoxy group include alkoxy groups having 1 or more and 4 or less carbon atoms, such as an ethoxy group and a methoxy group. Examples of the alkyl group include alkyl groups having 1 or more and 4 or less carbon, such as a methyl group, an ethyl group, a propyl group, and a butyl group. Examples of the halogeno group include a fluoro group, a chloro group, a bromo group, and an iodine group. The compounds having these functional groups are suitable because a compound containing a nitrogen atom is not generated as a reaction byproduct.

Among the above, it is suitable to use the compound having a halogeno group as the precursor because a strong acid hydrogen halide is generated as a reaction byproduct. This is because, when the reaction byproduct remaining in the first film 121 is strong acid, strong acid to be generated from the acid generator in the resin layer to be formed thereon is difficult to be diluted and a polymerization reaction is difficult to be suppressed as compared with the case where the reaction byproduct is neutral or weak acid.

For the acidity of the reaction byproduct, the acid dissociation constant (pKa) can be used as the index. In the Bronsted-Lowry definition, the acid dissociation constant takes a negative common logarithm for the equilibrium constant Ka in a dissociative reaction in which hydrogen ions are emitted from acid. In this case, the acid dissociation constant is a value when a target substance is dissolved in 25° C. water. Also in a reaction in which no hydrogen ions are generated, the definition by Lewis is usable for acids and bases. A substance donating an unshared electron pair is defined as a basic substance and a substance capable of receiving an unshared electron pair is defined as an acid substance. It is possible that the acid generator generates acid defined by Lewis, and then a resin layer is polymerized. In the case of the definition by Lewis, a substance which is more likely to donate an unshared electron pair is a strongly basic substance. The strength of the basicity is similarly defined by the acid dissociation constant using the equilibrium constant in a reaction. In that case, almost the same value as the acid dissociation constant in the above-described case where hydrogen ions are generated can be set as the index of a strong base or a weak base or a strong acid or a weak acid.

As the precursor, those generating a compound having an acid dissociation constant pKa of 3 or less as the reaction byproduct are suitable. Examples of such a precursor include precursors having a chloro group, a bromo group, or an iodine group as a functional group among precursors having a halogeno group. As the pKa in each hydrogen halide, HF has a pKa=3.2, HCl has a pKa=−3.7, HBr has a pKa=−4.1, and HI has a pKa=−10.

The precursor having a chloro group as a functional group is suitably used because not only a strong acid reaction byproduct is generated but the film formation rate is good at a relatively low temperature of 200° C. or less.

Examples of the precursor having a chloro group as a functional group include titanium tetrachloride, silicon tetrachloride, tantalum pentachloride, hafnium tetrachloride, zirconium tetrachloride, niobium pentachloride, disilicon hexachloride, tetrachlorodialkyldisilane [$(CH_3(CH_2)n)_2$-$Si_2$—$Cl_4$], dichlorotetraalkyldisilane [$(CH_3(CH_2)n)_4$-$Si_2$—$Cl_2$], and bistrichlorosilylalkane [$CH_3(CH_2)n$-$Si_2$—$Cl_6$]. n is suitably 1 to 4. As reactive gas, an oxidizer is suitably used and pure water and ozone are specifically mentioned. In a film formation process, the precursor is deposited on the substrate alternately with an oxidizer, and then the deposition/reaction is repeated for each atomic layer.

Even a precursor generating compounds containing nitrogen atoms as a reaction byproduct is usable insofar as the nitrogen atom atomic composition ratio of the film can be suppressed to 2.5% or less. As such a precursor, tetra (dimethylamino)titanium (TDMAT) is mentioned.

However, it is suitable not to use the precursor generating compounds containing nitrogen atoms as a reaction byproduct, if possible. Specifically, it is suitable not to use compounds containing substituted or unsubstituted amino groups as a functional group. Precursors containing substituted or unsubstituted amino groups have been widely used in a low temperature process because film formation can be achieved at a relatively low temperature. However, when a resin layer is formed using a resin composition containing an acid generator on a film, a polymerization reaction by acid is blocked by the nitrogen atoms as described above, and therefore such a precursor is not suitable for use. In particular, a compound having an alkylamino group generates a basic compound as a reaction byproduct of a film. For example, in the case of compounds having a dimethylamino group and a monomethylamino group as a functional group, strongly basic dimethylamine (pKa=10.7) and strongly basic monomethylamine (pKa=10.6) are generated as a reaction byproduct, respectively. It is presumed that, when nitrogen atoms derived from these basic reaction byproducts are present in the film, acid is not only attracted by a shared electron pair of the nitrogen atoms but neutralized, and therefore the polymerization reaction by acid is further blocked.

When the low temperature film formation is difficult to achieve only by the above-described precursor and an oxidizer, a catalyst may be deposited on the substrate simultaneously with the deposition of each gas. As a material suitable as the catalyst, basic compounds are mentioned. On the other hand, when the influence on the polymerization reaction by the acid of the resin layer is taken into consideration, weakly basic compounds having a pKa of 6 or less are suitable and, specifically, pyridine, picoline, and aniline are mentioned. It is considered that the compounds contain nitrogen atoms but the compounds do not have a large influence on the polymerization reaction by the acid of the resin layer. This is because the catalyst achieves a function of lowering the reaction temperature of the precursor and the oxidizer, the catalyst itself is not a film constituent component, and the addition amount of the catalyst is usually small, and thus, even when the catalyst remains in the film, the content ratio is slight.

After forming the first film 121, the first film 121 can be patterned into a desired shape. Specifically, a resist is formed on the first film 121, and then an unnecessary portion is removed by dry etching, wet etching, or the like. As illustrated in FIG. 1D, when a resist is formed on the front surface of the substrate having a through-hole, it is suitable to form a resist into a film shape, and then paste the same thereto. Alternatively, a resist may be formed beforehand, the first film 121 may be formed thereon, and then the resist may be lifted off, whereby the first film 121 may be formed into a desired shape.

3. Process of Forming Resin Layer

Figure 1E:
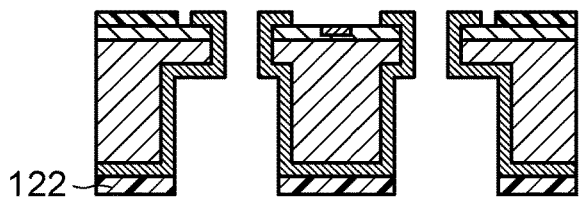

Next, as illustrated in FIG. 1E, the adhesive 122 containing resin is applied as a resin layer to the rear surface of the first substrate 131. Examples of coating methods include a spin coating method, a method including laminating a resin formed into a film shape, and a method including bringing the rear surface of the first substrate 131 into contact with a base material to which the adhesive 122 is applied, and then transferring the same. After applying the adhesive 122, it is suitable to perform heat treatment at a temperature lower than the curing temperature of the resin contained in the adhesive 122 to volatilize a solvent.

As the adhesive 122, a thermosetting adhesive or a photocurable adhesive is suitably used. The adhesive 122 contains a compound polymerizable with acid and an acid generator. In the case of the thermosetting adhesive, a thermal acid generator is contained as the acid generator. In the case of the photocurable adhesive, a photoacid generator is contained as the acid generator. The adhesive 122 is cured by the progress of a polymerization reaction of the compound polymerizable with acid by hydrogen ions generated from the acid generator with heat and light as a trigger.

Examples of the compound polymerizable with acid include a vinyl resin, a styrene resin, a vinyl ether resin, and a cyclic ether resin. Examples of the cyclic ether resin include an oxetane resin and an epoxy resin. The compound polymerizable with acid is suitably an epoxy resin because the liquid resistance is high. In order to uniformly apply the adhesive 122, the curing degree and the viscosity of the resin of the adhesive are suitably low.

Examples of the thermal acid generator include a sulfonium salt, a phosphonium salt, an ammonium salt, carboxylic acid ester, and sulfonic acid ester. The content of the thermal acid generator is preferably 0.5% by mass or more and 40.0% by mass or less based on the total mass of the entire resin layer.

Examples of the photoacid generator include a sulfonium salt and an iodonium salt. The content of the photoacid generator is preferably 0.1% by mass or more and 15.0% by mass or less based on the total mass of the entire resin layer.

Figure 1F:
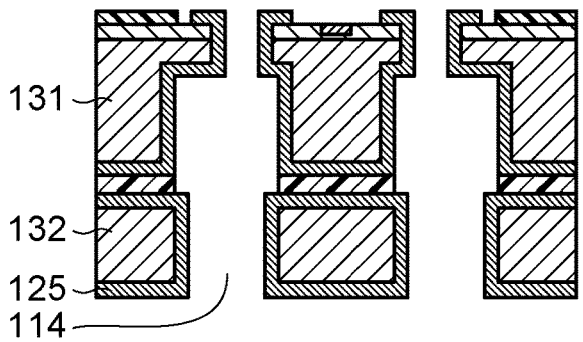
Figure 1F:
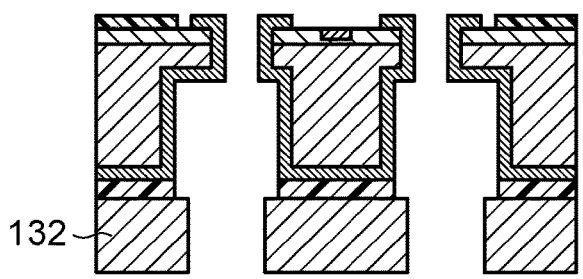
Figure 1G:
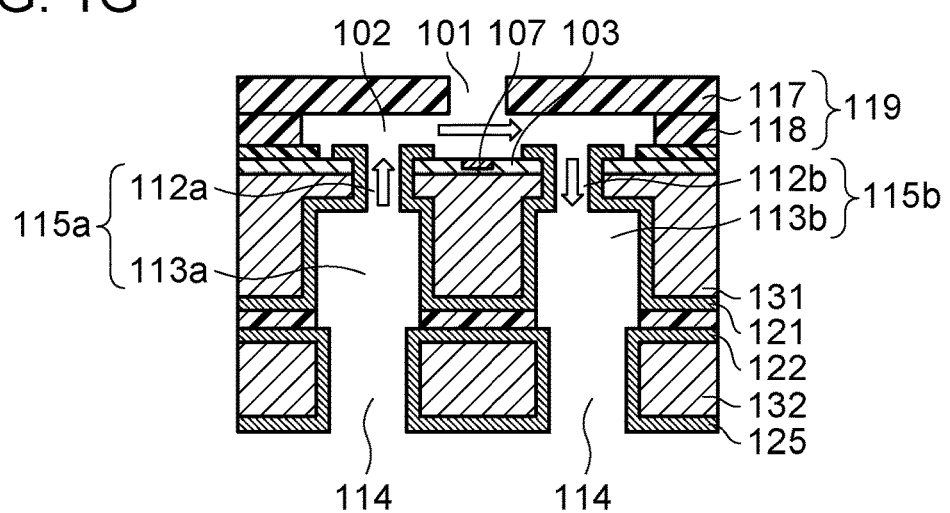

Next, the second substrate 132 is prepared in which the third flow passage 114 which is a through-hole is formed, and then bonded to the first substrate 131 through the adhesive 122 as illustrated in FIG. 1F. A substrate similar to the first substrate 131 is usable as the second substrate 132 and particularly a silicon substrate is suitably used. As illustrated in FIG. 1F, the second substrate 132 is suitably covered with the film 125 similar to the first film 121 covering the first substrate 131 in view of preventing the corrosion by liquid, such as ink. The film 125 of the second substrate 132 can be formed by the same manner as that of the first film 121. When the second substrate 132 is a substrate having high liquid resistance, such as alumina, quartz, silicon carbide, and an epoxy resin, the second substrate 132 may not be covered with the film 125 as illustrated in FIG. 1F'.

The adhesive 122 is cured after bonding of the substrates. When the adhesive 122 is formed using a thermosetting resin composition, the adhesive 122 can be sufficiently cured by heat-treating the bonded substrate at the curing temperature of the resin. On the other hand, when the adhesive 122 is formed using a photocurable resin composition, the adhesive 122 is irradiated with ultraviolet rays with an ultraviolet exposure device to be semi-cured beforehand, and then the first substrate 131 is bonded to the second substrate 132. After the bonding, the bonded substrate is heat-treated at the curing temperature of the resin to sufficiently cure the adhesive 122.

Next, the discharge port formation member 119 is formed on the front surface of the first substrate 131 as illustrated in FIG. 1G. First, a dry film resist in which a photocurable resin is applied onto a film base material is pasted to the first substrate 131. The photocurable resin is suitably an epoxy resin. Thereafter, the side wall 118 of the discharge port formation member 119 is patterned by exposing/developing the dry film resist. Next, the top plate 117 of the discharge port formation member 119 is similarly patterned using the dry film resist. Finally, unexposed portions are developed to form the discharge port 101 and the pressure chamber 102, so that a liquid discharge head is completed.

In this embodiment, although the adhesive 122 is applied to the first substrate 131 side, the adhesive 122 may be applied to not the first substrate 131 but the second substrate 132 side. Moreover, in this embodiment, although the discharge port formation member 119 was finally formed, the discharge port formation member 119 may be formed before the bonding of the substrates.

Second Embodiment

FIGS. 2A to 2F are views explaining a method for manufacturing a liquid discharge head according to a second embodiment of the present disclosure step by step. FIGS. 2A to 2F all illustrate cross-sectional views of the liquid discharge head.

From FIG. 2A to FIG. 2D, the first film 121 is formed on the first substrate 131 in the same manner as in the first embodiment.

Figure 2A:
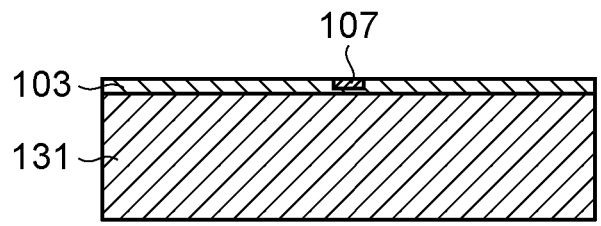
FIGS. 2A to 2F are cross-sectional views illustrating a method for manufacturing a liquid discharge head of a second embodiment of the present disclosure.
Figure 2B:
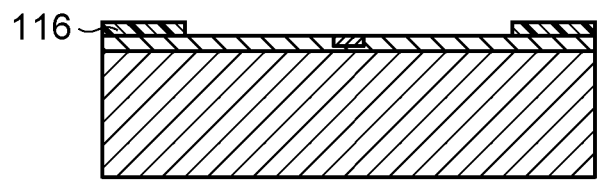
Figure 2C:
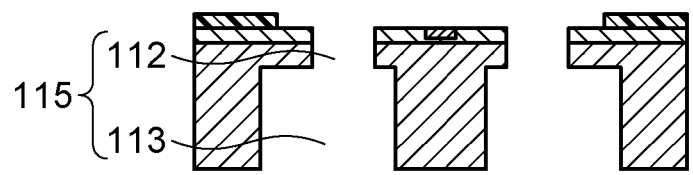
Figure 2D:
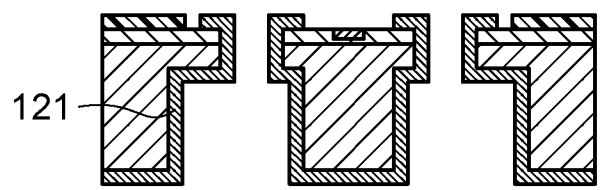
Figure 2E:
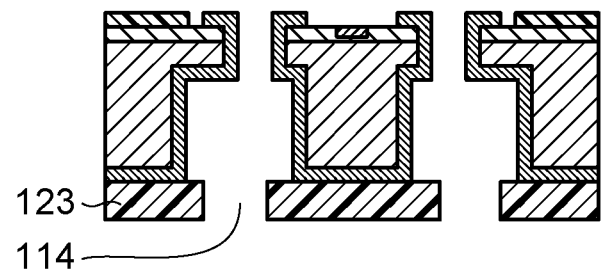

Next, as illustrated in FIG. 2E, a resin structure 123 is formed as a resin layer on the first film 121 provided on the rear surface of the first substrate 131. The second embodiment is different from the first embodiment in that the resin layer is not the adhesive layer and the resin layer is equivalent to the second substrate in the first embodiment and is a structure forming a part of a flow passage.

The resin structure 123 suitably contains a photosensitive resin. This is because a desired structure, such as the third flow passage 114, can be easily formed by selective irradiation of light in a process described later.

The resin structure 123 contains a compound polymerizable with acid and a photoacid generator.

Examples of the compound polymerizable with acid include a vinyl resin, a styrene resin, a vinyl ether resin, and a cyclic ether resin. Examples of the cyclic ether resin include an oxetane resin and an epoxy resin. The compound polymerizable with acid is suitably an epoxy resin because the ink resistance is high.

Examples of the photoacid generator include a sulfonium salt and an iodonium salt. The content of the photoacid generator is preferably 0.1% by mass or more and particularly preferably 0.5% by mass or more based on the total mass of the entire resin structure 123. When the content of the photoacid generator is 0.1% by mass or more, a photosensitive resin can be sufficiently cured. The content of the photoacid generator is preferably 15.0% by mass or less and particularly preferably 7.0% by mass or less based on the total mass of the entire resin structure 123. When the content of the photoacid generator is 15.0% by mass or less, the relative content to the resin is low, and therefore pattern accuracy is good and a coating performance reduction due to a viscosity increase is suppressed. The photoacid generators of sulfonium salt and iodonium salt are photoacid generators generating strong acid in a small amount. Therefore, the photoacid generators have a feature that a resin can be cured by the addition of a slight amount of the photoacid generators. On the other hand, it is considered that, when the content of the photoacid generator is particularly small, specifically 7.0% by mass or less, polymerization inhibition is likely to occur due to a slight amount of a reaction byproduct near the interface with the first film 121 contacting the resin structure 123. However, even in such a case, by reducing the nitrogen atom atomic composition ratio of the film as with the present disclosure, a reduction in the adhesiveness between the film and the resin layer can be sufficiently prevented.

As a method for forming the resin structure 123, when a surface on which the resin structure 123 is to be formed of the first substrate 131 has a hollow, such as the flow passage 115, as illustrated in FIG. 2E, a lamination method is suitably used. First, a photosensitive resin is given onto a film base material by spin coating. Examples of the film base material include polyethylenetelephthalate and polyethylenenaphthalate. Subsequently, the photosensitive resin applied onto the film base material is pasted to the rear surface of the first substrate 131, and then only the film base material is removed, whereby a layer serving as the resin structure 123 can be formed. Thereafter, the resin is patterned to form the third flow passage 114. The third flow passage 114 can be formed by irradiating the resin with exposure light, such as ultraviolet rays, through a mask using an exposure machine, and then removing an unnecessary portion by a developing solution. After the development of the resin structure 123, it is suitable to cure the resin by performing heat treatment as necessary.

The thickness of the resin structure 123 can be set to 10 µm or more and 1000 µm or less.

Figure 2F:
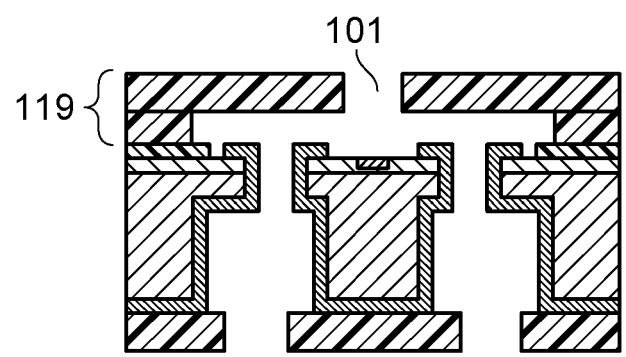

Next, the discharge port formation member 119 is formed in the same manner as in the first embodiment, whereby a liquid discharge head is completed as illustrated in FIG. 2F. The discharge port formation member 119 may be formed immediately before forming the resin structure 123 or immediately before forming the first film 121.

In this embodiment, the resin structure 123 was formed by the photosensitive resin. However, even when the resin structure 123 is formed by a resin not having photosensitivity, such as a thermosetting resin, the present disclosure can be applied. In this case, the patterning of the resin can be performed as follows. First, a thermosetting resin is pasted to the rear surface of the first substrate, and then cured by heat treatment. A photosensitive resist mask is formed on the cured resin, and then etching is performed by oxygen plasma.

Figure 3:
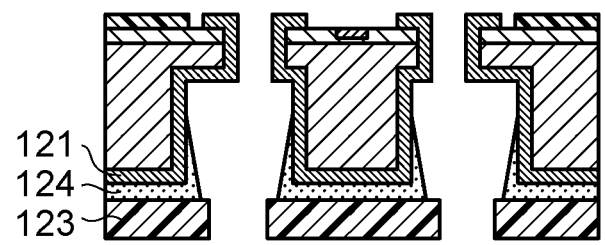
FIG. 3 is a cross-sectional view illustrating a modification of the method for manufacturing a liquid discharge head of the present disclosure.

Moreover, in this embodiment, although the first film 121 and the resin structure 123 directly contact each other, another film 124 (second film) may be inserted between the first film 121 and the resin structure 123 as illustrated in FIG. 3. In this case, although a manufacturing process increases, the presence of the second film 122 makes it difficult for a reaction byproduct remaining in the first film 121 to reach the resin structure 123, so that the adhesion reliability between the first film 121 and the resin structure 123 can be further improved.

The second film 124 suitably contains an oxide, a carbide, an oxynitride, or an acid carbide of an element selected from the group consisting of Ta, Zr, Hf, Nb, Si, and Ti because the element is resistant to liquid, such as ink, as with the first film 121. Examples of film formation techniques of the second film 124 include a sputtering method, a vacuum evaporation method, and a CVD method. Among the above, a sputtering method or a vacuum evaporation method is suitable because a reaction byproduct is hardly generated. As the thickness of the first film 121, the first film 121 suitably has a sufficient thickness such that a reaction byproduct from the first film 121 does not reach the resin structure 123 and the thickness is preferably 5 nm or more and particularly preferably 20 nm or more. When the thickness of the first film 121 is excessively large, cracking and the like occur in some times, and therefore the thickness is preferably 2 µm or less and particularly preferably 500 nm or less.

As the second film 124, an organic film is also usable. The organic film is suitably a resin polymerizable without using a polymerization reaction by an acid generator and, specifically, a benzocyclobutene resin is mentioned. In this case, the second film 124 is formed on the first film 121 by a transfer process, and thereafter the second film 124 is cured by heat treatment or the like. The thickness when the second film 124 is the organic film is suitably 0.1 µm or more and 20 µm or less.

EXAMPLES

Production of Sample

Example 1

A sample for evaluation was produced as follows. First, a 100 nm thick Ti-Oxide film was formed on the rear surface of a silicon substrate in which an ink supply port was formed by an atomic layer deposition method. Titanium tetrachloride was used as a precursor and the film formation temperature was set to 80° C. The structural formula of the precursor is shown in the following table 1. Subsequently, a 20 µm thick resin layer was formed on the produced Ti-Oxide film by the lamination method using a negative dry film resin (manufactured by TOKYO OHKA KOGYO CO., LTD., Trade Name: TMMF). The resin layer contains 90% by mass of an epoxy resin and contains 5% by mass of triarylsulfonium hexafluoroantimonate which is a photoacid generator based on the total mass of the entire resin layer. Thereafter, the resin layer was developed by being exposed by a projection exposure machine, and then immersed in propylene glycol monomethyl ether acetate (PGMEA).

Example 2

A sample was produced in the same manner as in Example 1, except forming a film using bistrichlorosilylmethane (BTCSM) as a precursor setting the film formation temperature to 70° C. and using pyridine as a catalyst.

Example 3

A sample was produced in the same manner as in Example 1, except using tetra(dimethylamino)titanium (TDMAT) as a precursor.

Comparative Example 1

A sample was produced in the same manner as in Example 1, except using penta(dimethylamino)tantalum (PDMAT) as a precursor.

Comparative Example 2

A sample was produced in the same manner as in Example 1, except using (tert-butylimido)tris(ethylmethylamino)tantalum (TBTEMT) as a precursor.

Evaluation of Sample
Evaluation of Adhesiveness

The cross section of the obtained sample was observed by an optical microscope or an electron microscope, and then confirmed whether there is a portion where the resin layer was peeled and floated from the film.

Moreover, a tape peel test was performed which includes pasting a 10 mm wide tape to the front surface of the resin layer surface of the sample, and then pulling the tape in a direction perpendicular to the substrate surface for peeling. At this time, it was confirmed whether the resin layer was peeled from the film formed on the substrate to adhere to the tape. The peeling force of the used tape was about 10 N/10 mm.

These evaluation results are shown in the following Table 1.

Atomic Composition of Film

Next, the produced sample was analyzed for the atomic composition of the film. The analysis results are shown in the following table 2. By photoelectron spectroscopy, the composition at a depth in increments of 3 to 10 nm was analyzed while etching the film in the film depth direction with Ar ions. Values obtained by equalizing the composition of portions, except data of the outermost surface in a state where Ar etching was not performed and data at a depth where a ground substrate began to be detected were defined as the atomic composition ratios.

TABLE 1

| | Ex. 1 | Ex. 2 | Ex. 3 | Comp. Ex. 1 | Comp. Ex. 2 |
|---|---|---|---|---|---|
| Film | Ti-Oxide | SiOC | Ti-Oxide | Ta-Oxide | Ta-Oxide |
| Film formation temperature | 80° C. | 70° C. | 80° C. | 80° C. | 80° C. |
| Precursor | Titanium tetrachloride | BTCSM | TDMAT | PDMAT | TBTEMT |
| Precursor structural formula | $\text{Cl}_4\text{Ti}$ structure | $\text{Cl}_3\text{Si-CH}_2\text{-SiCl}_3$ structure | Ti(N(CH$_3$)$_2$)$_4$ structure | Ta(N(CH$_3$)$_2$)$_5$ structure | (tBuN=)Ta(NEt$_2$)$_3$ structure |
| Presence or absence of peeling of resin layer by microscope observation | None | None | None | Peeled | Peeled |
| Presence or absence of peeling of resin layer by tape peel test | None | None | Peeled | Peeled | Peeled |

TABLE 2

| | Film | Precursor | Film formation temperature | Atomic composition ratio (at %) | | | | | | |
|---|---|---|---|---|---|---|---|---|---|---|
| | | | | Ta | Ti | Si | O | C | N | Cl |
| Ex. 1 | Ti-Oxide | Titanium tetrachloride | 80° C. | 0.0 | 34.9 | 0.0 | 63.0 | 0.1 | 0.0 | 2.0 |
| Ex. 2 | SiOC | BTCSM | 70° C. | 0.0 | 0.0 | 35.0 | 51.0 | 13.0 | 0.5 | 0.5 |
| Ex. 3 | Ti-Oxide | TDMAT | 80° C. | 0.0 | 19.3 | 0.0 | 75.7 | 2.6 | 2.4 | 0.0 |
| Comp. Ex. 1 | Ta-Oxide | PDMAT | 80° C. | 21.9 | 0.0 | 0.0 | 26.8 | 6.8 | 44.5 | 0.0 |
| Comp. Ex. 2 | Ta-Oxide | TBTEMT | 80° C. | 25.9 | 0.0 | 0.0 | 29.0 | 6.9 | 38.3 | 0.0 |

In the samples of Example 1 and Example 2, the peeling of the resin layer was not observed in the state after the completion and the resin layer was not peeled even by the tape peel test and the film and the resin layer were firmly stuck to each other. This is considered to be because the nitrogen atom atomic composition ratios of the films of the samples were as low as 0.0% and 0.5% and reaction inhibition of the epoxy resin in the resin layer hardly occurred. The film formation temperature was as low as 70 to 80° C. but a practical film formation rate of 0.05 nm/cycle or more was obtained. In the samples of Example 1 and Example 2, the reaction byproduct is strong acid HCl and the nitrogen atom in the sample of Example 2 is considered to be derived from the pyridine which was the catalyst.

In the sample of Example 3, the peeling was not observed in the state after the completion but, when the tape peel test was performed, the resin layer was peeled from the film, so that the resin layer adhered to the tape. The adhesion strength between the film and the resin layer is poorer than that of the samples of Example 1 and Example 2 but the sample can be sufficiently used depending on the intended use. It is considered that the peeling was not observed in the state after the completion because the composition ratio of the nitrogen atoms was as low as 2.4% and reaction inhibition of the epoxy resin in the resin layer hardly occurred.

In the samples of Comparative Example 1 and Comparative Example 2, the floating of the resin layer from the film partially occurred in various places of the samples after the sample completion. Furthermore, when the tape peel test was performed, the resin layer was peeled from the film, so that the resin layer adhered to the tape. In the samples of Comparative Example 1 and Comparative Example 2, the nitrogen atoms were detected at high concentrations of 38.3% and 44.5%, respectively, in terms of the atomic composition ratio. It is considered that a large amount of unreacted methylamino groups and methylamine molecules which are reaction byproducts remained in the film. It is presumed that only low adhesiveness such that the peeling of the resin layer occurred was obtained because a polymerization reaction of the epoxy resin was blocked by the remaining nitrogen atoms.

Production of Liquid Discharge Head

Example 4

A liquid discharge head was produced by the manufacturing method illustrated in FIGS. 2A to 2F.

First, as illustrated in FIG. 2A, an 8 inch silicon substrate (Thickness: 730 m) was prepared as the first substrate 131 by a photolithography process. On the front surface, aluminum wiring and an interlayer insulation film of a silicon oxide thin film were formed as the surface membrane layer 103 and a heater thin film pattern of tantalum nitride was formed as the energy generating element 107. Furthermore, a contact pad for electrical connection to an external control unit was formed. Thereafter, an ultraviolet curing tape was pasted to the front surface of the first substrate 131 as a surface protection tape, and then the rear surface of the first substrate 131 was polished and smoothed using CMP (Chemical mechanical polishing). Then, the resultant substance was washed with a mixed liquid of ammonia and a hydrogen peroxide solution to remove a slurry, and further the surface protection tape was removed.

Next, as illustrated in FIG. 2B, a polyamide resin (manufactured by Hitachi Chemical Co., Ltd., Trade Name: HIMAL) was applied as the adhesion layer 116 by a spin coating method, and then the adhesion layer 116 was patterned into a desired shape by photolithography and dry etching by oxygen plasma.

Next, the flow passage 115 was formed in the first substrate 131 as illustrated in FIG. 2C. After a protection tape was pasted to the front surface side of the first substrate 131, a resist mask for forming the second flow passage 113 was formed on the rear surface side of the first substrate 131 by photolithography and dry etching by oxygen plasma. Thereafter, a groove serving as the second flow passage 113 was formed by etching. For the etching of the flow passage, a Bosch process of repeating etching by $SF_6$ gas and deposition by $CF_4$ gas was used. The etching was stopped when the average groove depth reached 500 μm. After removing the surface protection tape, the resist and an etching deposit were removed with a peeling liquid containing hydroxylamine as the main component. Subsequently, a rear surface protection tape was pasted to the rear surface side of the first substrate 131, and then a resist for forming the first flow passage 112 was formed on the front surface side of the first substrate 131 in the same manner as above. Thereafter, two or more of the first flow passages 112 containing a hole were formed by the same Bosch process as above from the front surface side of the first substrate 131. After removing the rear surface protection tape, the resist and the deposit were removed with the same peeling liquid as above.

Next, the first film 121 was formed by the atomic layer deposition method on the first substrate 131 as illustrated in FIG. 2D. The first substrate 131 was disposed in an atomic layer deposition film formation apparatus, and then a Ti-Oxide film was formed with a thickness of 100 nm at a temperature of 80° C. using titanium tetrachloride as a precursor and using pure water as an oxidizer. Then, an etching mask for removing an unnecessary portion of the first film 121 was formed on the front surface side of the first substrate 131. The etching mask was formed by laminating a positive resist formed into a film, exposing the same by a stepper exposure machine, and then developing the resultant substance with an alkali liquid. Then, a portion not covered with the etching mask of the first film 121 was removed by dry etching by $CF_4$ gas.

Next, a photosensitive negative dry film (manufactured by TOKYO OHKA KOGYO CO., LTD., Trade Name: TMMF) containing an epoxy resin serving as the resin structure 123 was laminated to the rear surface side of the first substrate 131 as illustrated in FIG. 2E. Thereafter, the dry film was mask-exposed by a projection exposure machine and patterned, and then immersed in PGMEA for development, whereby the third flow passage 114 was formed. Thereafter, the resin was cured in an oven at 200° C. for 1 H.

Next, the discharge port formation member was formed, so that the liquid discharge head was produced as illustrated in FIG. 2F. When the obtained liquid discharge head was evaluated in the same manner as in the samples described above, the peeling of the resin structure was not observed in the state after the completion and the resin structure was not peeled even by the tape peel test.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-089519 filed Apr. 28, 2017, which is hereby incorporated by reference herein in its entirety.

What is claimed is:

1. A method for manufacturing a liquid discharge head having:
   a discharge port discharging liquid; and
   an element generating energy to be utilized for discharging the liquid, wherein
   the liquid discharge head has a laminate having a substrate, a film formed by an atomic layer deposition method on the substrate, and a resin layer formed on the film, and
   the laminate is formed by a method for manufacturing the laminate including forming the film on the substrate by the atomic layer deposition method, and forming a layer containing a compound polymerizable with acid and an acid generator, and then curing the layer to form the resin layer on the film, in which a nitrogen atom atomic composition ratio of the film is 2.5% or less, the nitrogen atomic composition ratio being a number ratio of nitrogen atoms in the film to all atoms in the film except for hydrogen atoms.

2. The method for manufacturing a liquid discharge head according to claim 1, wherein
   a compound containing an element selected from the group consisting of Ta, Zr, Hf, Nb, Si, and Ti is used as a precursor in the formation of the film by the atomic layer deposition method.

3. The method for manufacturing a liquid discharge head according to claim 1, wherein
   the formation of the film by the atomic layer deposition method includes generating a reaction byproduct by desorption from the precursor; and
   an acid dissociation constant of the reaction byproduct is 3 or less.

4. The method for manufacturing a liquid discharge head according to claim 1, wherein
   a compound having a halogeno group is used as the precursor in the formation of the film by the atomic layer deposition method.

5. The method for manufacturing a liquid discharge head according to claim 4, wherein
   the compound having the halogeno group is a compound selected from the group consisting of titanium tetrachloride, silicon tetrachloride, tantalum pentachloride, hafnium tetrachloride, zirconium tetrachloride, niobium pentachloride, disilicon hexachloride, tetrachlorodialkyldisilane, dichlorotetraalkyldisilane, and bis-trichlorosilylalkane.

6. The method for manufacturing a liquid discharge head according to claim 1, wherein
   the formation of the film by the atomic layer deposition method is performed at a temperature of 200° C. or less.

7. The method for manufacturing a liquid discharge head according to claim 1, wherein
   the substrate has a through-hole, and
   the resin layer is a resin structure having an opening communicating with the through-hole.

8. The method for manufacturing a liquid discharge head according to claim 1, wherein
   the element is provided on a front surface of the substrate, and the resin layer is provided on a rear surface of the substrate.

9. The method for manufacturing a liquid discharge head according to claim 1, wherein
   the film is a liquid resistant film.

10. The method for manufacturing a liquid discharge head according to claim 1, wherein
    the film comprises an oxide, a carbide, an oxynitride, or acid carbide of an element selected from the group consisting of Ta, Zr, Hf, Nb, Si, and Ti.

* * * * *